United States Patent [19]

Yeh

[11] Patent Number: 5,448,642
[45] Date of Patent: Sep. 5, 1995

[54] METHOD FOR CODING LOW ENTROPHY DATA

[75] Inventor: Pen-Shu Yeh, Silver Spring, Md.

[73] Assignee: The United States of America as represented by the Administrator of the National Aeronautics and Space Administration, Washington, D.C.

[21] Appl. No.: 195,899

[22] Filed: Feb. 14, 1994

Related U.S. Application Data

[63] Continuation of Ser. No. 881,575, May 12, 1992.

[51] Int. Cl.⁶ .......................... G06K 9/36; G06K 9/46
[52] U.S. Cl. ............................................. 382/232; 348/390
[58] Field of Search ................... 382/56; 358/426, 433; 341/51, 67, 76; 348/390, 409

[56] References Cited

U.S. PATENT DOCUMENTS

| | | | |
|---|---|---|---|
| 3,524,926 | 8/1970 | Starr et al. | 358/426 |
| 4,447,886 | 5/1984 | Meeker | 364/725 |
| 4,578,704 | 3/1986 | Gharavi | 358/135 |
| 4,626,829 | 12/1986 | Hauck | 340/347 |
| 4,646,148 | 2/1987 | Lienard et al. | 382/56 |
| 4,654,877 | 3/1987 | Shimoni et al. | 382/56 |
| 4,841,299 | 6/1989 | Weaver | 358/426 |
| 4,939,583 | 7/1990 | Tsuboi et al. | 358/261.1 |
| 5,021,891 | 7/1991 | Lee | 358/432 |
| 5,063,608 | 11/1991 | Siegel | 382/56 |

FOREIGN PATENT DOCUMENTS

| | | |
|---|---|---|
| 56-165463 | 5/1980 | Japan . |
| 622779 | 6/1985 | Japan . |
| 6225541 | 7/1985 | Japan . |

Primary Examiner—Stephen Chin
Assistant Examiner—Timothy J. May
Attorney, Agent, or Firm—Robert D. Marchant; Guy M. Miller

[57] ABSTRACT

A method of lossless data compression for efficient coding of an electronic signal of information sources of very low information rate is disclosed. In this method, S represents a non-negative source symbol set, $\{s_0, s_1, s_2, \ldots s_{N-1}\}$ of N symbols with $s_i = i$. The difference between binary digital data is mapped into symbol set S. Consecutive symbols in symbol set S are then paired into a new symbol set $\Gamma$ which defines a non-negative symbol set containing the symbols $\{\gamma_m\}$ obtained as the extension of the original symbol set S. These pairs are then mapped into a comma code which is defined as a coding scheme in which every codeword is terminated with the same comma pattern, such as a 1. This allows a direct coding and decoding of the n-bit positive integer binary digital data differences without the use of codebooks.

19 Claims, 5 Drawing Sheets

METHOD FOR CODING LOW ENTROPHY DATA

This application is a continuation of application Ser. No. 07/881,575, filed May 12, 1992.

ORIGIN OF THE INVENTION

The invention described herein was made by an employee of the United States Government, and may be manufactured and used by or for the Government for governmental purposes without the payment of any royalties thereon or therefor.

TECHNICAL FIELD

This invention relates to data compression in general and specifically to a new method of lossless data compression for efficient coding of information sources of very low information content.

BACKGROUND ART

Modern information sources, such as imaging, non-imaging, voice data, etc., are often digitized to a fixed quantization level, for example, 8 or 12 bits/sample of digital data. These will further be processed, modulated for transmission or stored on mass media. The actual information content of such sources can be much lower than its quantization level. An efficient coding of these sources by converting the source digital representation into another form of digital representation can reduce the total data rate tremendously.

In a distortionless source coding scheme, also known as data compression, data reduction is achieved by removing the redundancy in the data and efficiently representing the information with codewords. An optimal coding scheme will produce expected codeword length close to the information measure, that is, the entropy of the data source. It was known that the Huffman code is an optimal block code given a source with known statistics. For actual data sources, due to the varying statistics in the source, several Huffman codebooks will have to be used to optimally adapt to the source variation. R. F. Rice proposed in 1979 a scheme which effectively adapts to the source without the need of storing codebooks. This scheme includes an option, $\psi_0$, to operate at low source information content. This option first generates the comma code of a block of samples, then groups every three bits and codes them with a Huffman code. Run-length code, followed by Huffman code, has been used in products like the fax machine at low source entropy rate. Another scheme with potential for coding at low entropy rate is the arithmetic codes.

The $\psi_0$ option in the Rice algorithm requires an intermediate buffer to hold the comma codes of a block of samples, subsequent coding requires a Huffman table to generate the codeword. The decoding is more complicated due to the lack of structure in the Huffman Table. Run-length code is effective when the input symbol has only two levels. For symbols with multiple levels, which is mostly true of imaging data, the additional complexity for coding levels decreases the efficiency of the code. Arithmetic coding technique, with its promise to produce codeword length closer to the entropy than Huffman code, requires tables of probability distribution of the data or adapts slowly to the variation of data statistics.

STATEMENT OF THE INVENTION

It is therefore an object of the present invention to provide an improved method for coding and decoding signal sources having a low information rate.

A further object of the invention is to provide a coding method that utilizes an algorithm which can be implemented in simple logic and does not require an intermediate buffer or Huffman code books.

These and other objects are achieved by providing a method to be used for efficient coding of information sources of very low information content, generally less than 1.5 bits/sample. This method is also distortionless, meaning that the reconstructed data will be the exact duplicate of the original information source without any bit loss.

The invented algorithm can be implemented in very simple logic, thus lends itself to high speed implementation. This invention also pushes the performance of conventional Huffman code below the 1 bit/symbol lower bound. It is easier to implement than the $\psi_0$ option of the Rice algorithm by eliminating the Huffman codebook and the intermediate working buffer. The method is conceived to work with data of intermittent zero-valued symbols. It presents as an alternative to the complicated concatenation of run-length code with Huffman code, such as used in the fax machine.

The procedure of grouping in the 2nd-extension and the 3rd-extension by first summing the symbol indices, and the steps of mapping into another symbol set $\Gamma$ are all new and innovative. The decoding procedure is a direct inverse operation, therefore is new as well.

DETAILED DESCRIPTION OF THE INVENTION

The present inventive method operates most efficiently on signal sources of information measure smaller than 2 bits/sample. Two schemes are described: the 2nd-extension and the 3rd-extension codes. The 2nd-extension code is optimal in the range of approximately 0.75 bits/sample to 1.5 bits/sample, and the 3rd-extension provides better coding performance under approximately 0.75 bit/sample information content. This technique can also be extended to higher order, the n-th extension, using the same approach.

Figure 1:
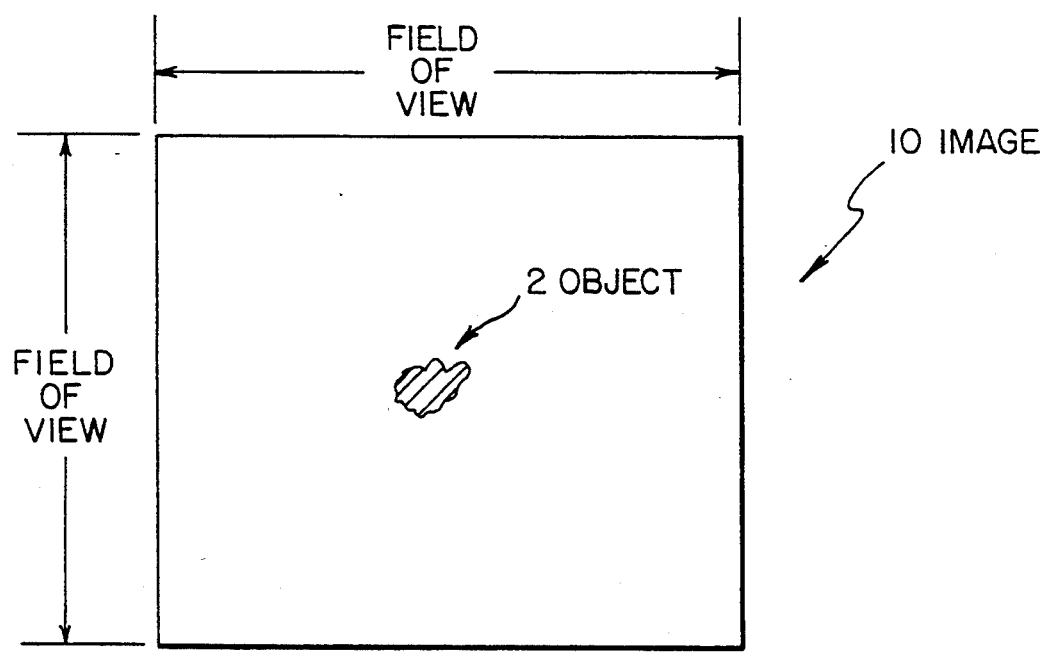
FIG. 1 is a depiction of a low information rate image in a hypothetical field of view.

Many "images" or electronic signals of low information content exist in modern information sources. For example, if one were to "image" a plain sheet of paper with a period right in the center, most of the "image signal" would be the white background. Another example would be an image signal taken in outer space from a satellite pointed away from our solar system; most of this image signal is darkness. Therefore, to store or transmit an image signal of low information content, such as image 10 having an object 2 in a hypothetical field of view as depicted in FIG. 1, there are several methods available. It is possible to store/transmit image 10 in analog signal form. More commonly, the analog signal of image 10 is converted to digital signal data, i.e., into a large number of pixels within the field of view, with each pixel coded to an electronic signal representing a digital word containing a finite number of bits, e.g., an electronic signal representing a eight-bit word. An eight-bit word is commonly used and this allows each pixel to vary from black to white along a gray-scale consisting of 256 variations.

Figure 2:
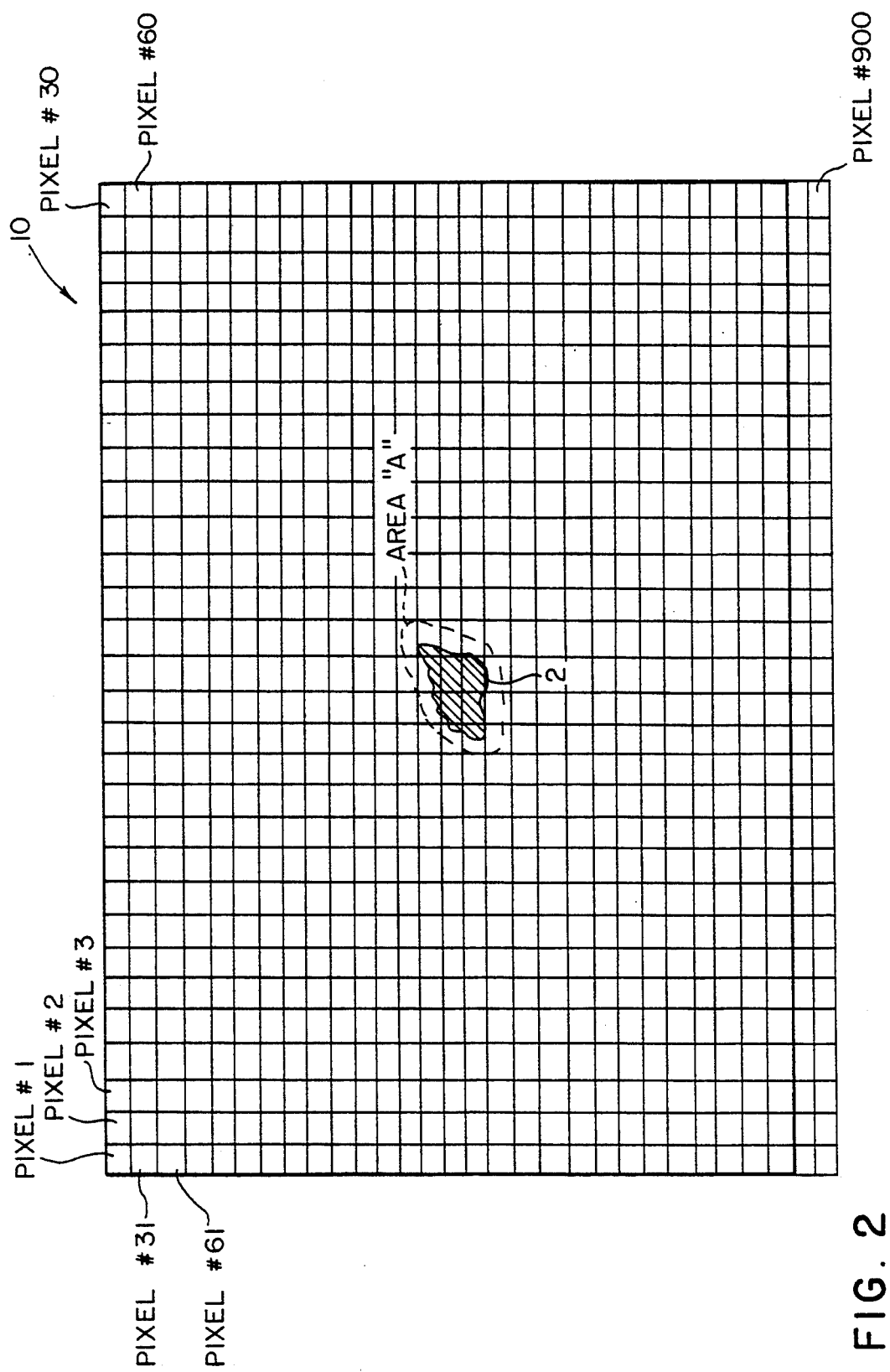
FIG. 2 is an expanded view of the image of FIG. 1.

Thus if the field of view of FIG. 1 is converted into a field of view of say 30×30 pixels, we now have a digitized image 10, as shown in FIG. 2. The first row of data in image 10 is pixel 1 through pixel 30; the second row of data in image 10 is pixel 31 through 60; and so on. Consequently, the field of view is built-up until image 10 now consists of an electronic signal of 900 pixels of data. However, as shown in FIG. 2, most of the pixels do not vary from one to the next and contain the same eight-bit information; i.e., the eight-bit code for pixel 1 is identical to the eight-bit code for pixels 2-30, and the eight-bit code for pixel 31 is the same as the eight-bit code for pixels 32-60. It is only the pixels within area "A" (the pixels that define object 2) that contain coded electronic signal information which differs from pixel to pixel. Image 10, therefore, consists of an electronic signal of very low entropy, and the most efficient method of storing or transmitting this electronic signal 10 is to compress the electronic signal by some means.

Figure 3:
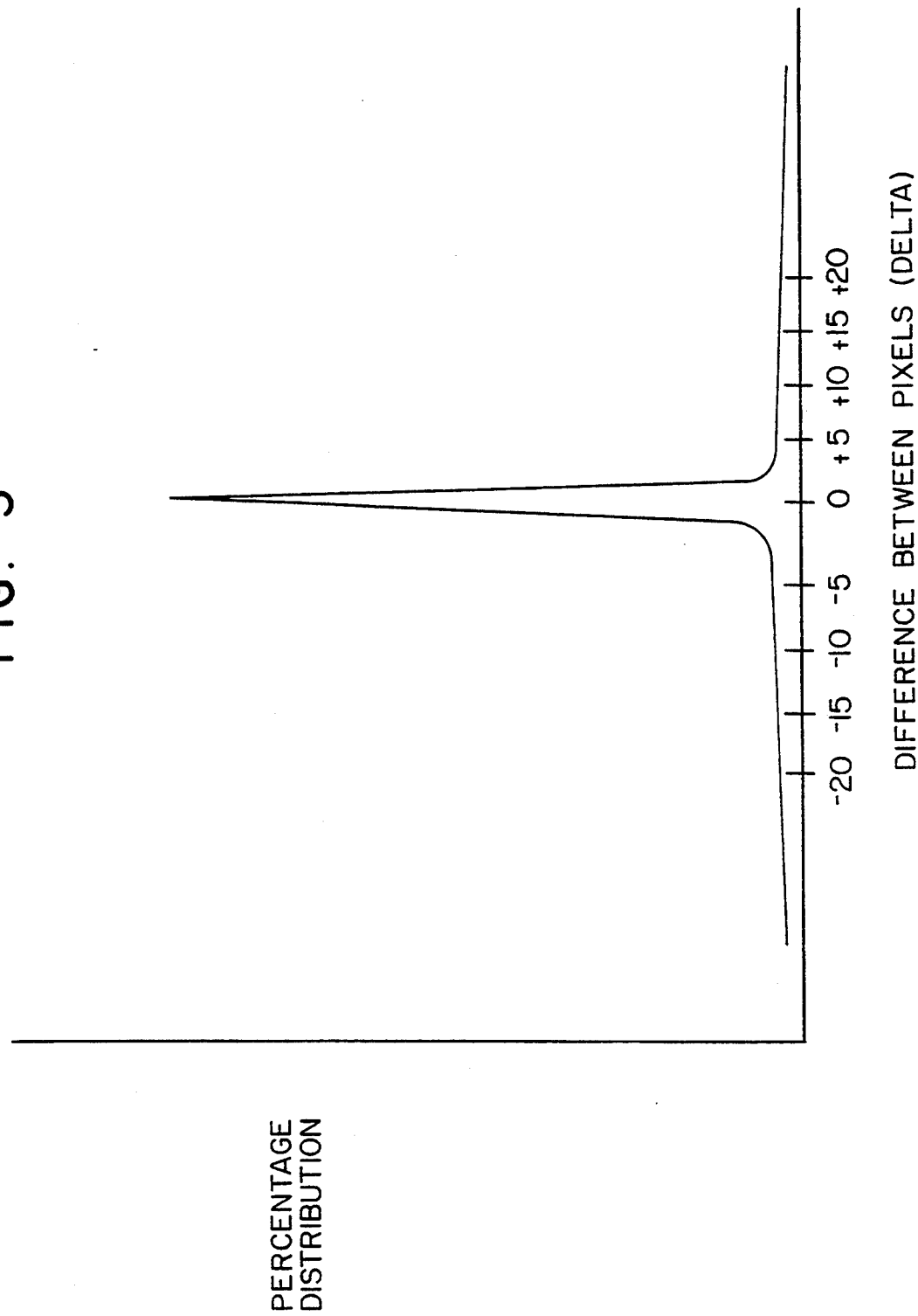
FIG. 3 is a histogram of the expected difference between pixels of a low entropy image.

One generally accepted method of compressing electronic signals containing low entropy data is to remove the redundancy in the signals and represent the information within image 10 with codewords, such as obtained from Huffman coding technique. This type of coding works particularly well when the statistics of the signals can be predicted with relative certainty. As stated above, neighboring (or adjacent) pixels contain similar eight-bit information, therefore, the difference from one like pixel to the next like pixel, in terms of their signal value on a 256 graduated grey scale, is mostly zero. FIG. 3 shows a histogram of the expected difference, delta, between pixels of a low entropy image such as image 10. As can be seen from FIG. 3, the majority of delta's between pixels falls in the range of −3 to +3, with the highest probability delta being 0. Therefore, instead of storing or transmitting the entire electronic signal containing an eight-bit word for each pixel, it is possible to store or transmit only the delta between pixels and this delta could then be converted later back into the electronic signal containing the eight-bit word for each pixel. Although the delta resulting from taking the difference between the current pixel and the previous pixel will require an electronic signal containing a nine-bit word to account for the negative values of delta, there are only 256 permissible values out of the 512 possible values. In this invention, this nine-bit delta word is mapped to an eight-bit word using a known method. Then the eight-bit mapped delta is further coded to remove the redundancy. One method, well known in the prior art of coding an electronic signal containing an eight-bit word to a shorter word when the statistics are known is Huffman coding. Huffman coding maps the eight-bit delta to a shorter expected code word, e.g., two to four bits on the average. The problem with Huffman coding for signals containing low entropy, other than that it needs a code book for every changing statistics, is that the optimal Huffman code puts a lower bound of 1 bit/symbol on the expected codeword length of a block code. For signals with entropy lower than 1 bit/symbol, it is desirable to extend this lower bound of Huffman code below 1 bit. The present inventive method transforms the source data into a new symbol source before coding.

The general concept of my technique is as follows:

To begin with, I define S as a non-negative integer source symbol set, $\{s_0, s_1, s_2, \ldots s_{N-1}\}$ of N symbols with $s_i = i$. With n-bit data representation, N equals $2^n$. The delta between the n-bit pixels is then mapped into symbol set S using a known method as follows:

First let the current pixel value be x, the previous pixel be xp, and y=minimum of (xp, xmax - xp) where xmax=N-1.

Then use the following mapping functions:
If delta $>=0$
mapped delta=2*delta when delta $<=y$
mapped delta=y+delta when delta $>y$
If delta $<0$
mapped delta=−2*delta−1 when −y$<=$delta
mapped delta=y−delta when −y$>$delta One example of the delta mapping is given in the following for electronic signals containing eight-bit data. If xp=5, then y=5 and the mapped delta is decided by the current value of x:

| x | delta | mapped delta |
|---|-------|--------------|
| 0 | −5 | 9 |
| 1 | −4 | 7 |
| 2 | −3 | 5 |
| 3 | −2 | 3 |
| 4 | −1 | 1 |
| 5 | 0 | 0 |
| 6 | 1 | 2 |
| 7 | 2 | 4 |
| 8 | 3 | 6 |
| 9 | 4 | 8 |
| 10 | 5 | 10 |
| 11 | 6 | 11 |
| 12 | 7 | 12 |
| . | . | . |
| . | . | . |
| . | . | . |
| 255 | 250 | 255 |

I then pair-up (or group in 3's) consecutive symbols in symbol set S into a new symbol set $\Gamma$ which I define as a non-negative symbol set containing the symbols $\{\gamma_m\}$ obtained as the extension of the original symbol set S. For the 2nd-extension codes, $\Gamma$ has $N^2$ symbols and for the 3rd-extension codes, $\Gamma$ has $N^3$ symbols. Thus for the case of eight-bit symbols in set S the 2nd-extension has 256×256 possible paired combinations of symbol set S; i.e., $[s_0 s_0]$, $[s_1 s_0, s_0 s_1]$, $[s_2 s_0, s_1 s_1, s_0 s_2]$ etc. These pairs (or triples) are then mapped into a comma code which is defined as a coding scheme in which every codeword is terminated with the same comma pattern, such as a 1. In the present inventive method, the comma code of an integer m consists of m 0's followed by a 1. For example, the comma code for a 0 is 1, for a 1 it is 01, for a 2 it is 001, for a three it is 0001, for a 4 it is 00001, etc. This allows a direct coding and decoding of the electronic signals containing the eight-bit positive integer without the use of codebooks. The algorithms employed to code and decode are described below.

THE 2nd-EXTENSION METHOD

Coding

The coding procedure consists of the following steps:
1. Take every two symbols $s_i$, $s_j$ from set S, calculate $\beta = i+j$,
2. Calculate $m_s = \beta(\beta+1)/2$,
3. Calculate $m = m_s + j$.
4. Generate codeword for $\gamma_m$ using the comma code where $\gamma_m = m$.

Decoding

The decoding procedure has the following steps:
1. Obtain $\gamma_m$ by counting the 0's of the comma code,
2. Obtain $\beta$ and $m_s$ using Table 1 logic,
3. Calculate $j = m - m_s$,
4. Calculate $i = \beta - j$,
5. Assign $s_i = i$ and $s_j = j$.

TABLE 1

| | Decoding Logic | |
|---|---|---|
| m | $\beta$ | $m_s$ |
| 0 | 0 | 0 |
| 1,2 | 1 | 1 |
| 3,4,5 | 2 | 3 |
| 6,...,9 | 3 | 6 |
| 10,....,14 | 4 | 10 |
| 15,....,20 | 5 | 15 |
| 21,....,28 | 6 | 21 |
| 28,....,35 | 7 | 28 |

EXAMPLE OF CODING BY THE 2-nd EXTENSION METHOD

Suppose the difference between a group of 17 pixels is as follows:

| 0 | −1 | 2 | 0 | 0 | −1 | −1 | 1 | 0 | 0 | −3 | −2 | 1 | 2 | 0 | 0 |
|---|---|---|---|---|---|---|---|---|---|---|---|---|---|---|---|

The above differences are mapped into symbol set S as follows:
  The 0's map to $S_0$, the −1's map to $S_1$, the 1's map to $S_2$, the −2 maps to $S_3$, the 2's map to $S_4$, the −3 maps to $S_5$, and the 3's map to $S_6$.

Consecutive pairs of symbols in symbol set S are then mapped into the second symbol set $\Gamma$ as follows:
  The first pair, $S_0S_1$, is mapped to $\gamma_2$;
  The second pair, $S_4S_0$, is mapped to $\gamma_{10}$;
  The third pair, $S_0S_1$, are mapped to $\gamma_2$;
  The fourth pair, $S_1S_2$, are mapped to $\gamma_8$;
  The fifth pair, $S_0S_0$, are mapped to $\gamma_0$;
  The sixth pair, $S_5S_3$, are mapped to $\gamma_{39}$;
  The seventh pair, $S_2S_4$, are mapped to $\gamma_{25}$; and
  The eighth pair, $S_0S_0$, are mapped to $\gamma_0$;

The codeword for the new symbol set $\Gamma$ above is generated using the comma code as follows:
  $\gamma_2$ is coded as 001;
  $\gamma_{10}$ is coded as 00000000001;
  $\gamma_2$ is coded as 001;
  $\gamma_8$ is coded as 000000001;
  $\gamma_0$ is coded as 1;
  $\gamma_{39}$ is coded as 0000000000000000000000000000000000000001;
  $\gamma_{25}$ is coded as 00000000000000000000000001;
  $\gamma_0$ is coded as 1;

Therefore, the final code for this group of 16 pixels ends up as follows:
0010000000000100100000000110000000000000000000000-
00000000000000000001000000000000000000000000011

THE 3-rd EXTENSION METHOD

Coding

1. Take 3 symbols $s_i, s_j, s_k$ from set S, calculate $\beta = i+j+k$ and $\beta' = i+j$,
2. Calculate $m_s = \beta(\beta+1)/2$,
3. Find $m_i$ from Table 2,
4. Calculate $m = m_s + m_i + i$,
5. Generate codeword for $\gamma_m$ by using comma code Decoding 1. Obtain $\gamma_m$ by counting 0's of the comma code,
2. Obtain $\beta$ and $m_i$ from Table 2,
3. Calculate $m_s + i$ by $m_s + i = m - m_i$,
4. Use the value of $m_s + i$ as the value for m in Table 1, obtain $\beta$ and $m_s$,
5. Calculate i from values obtained in steps 3, 4,
6. Calculate i from $\beta - i$,
7. Calculate k from $\beta' - \beta$,
8. Assign $s_i = i$, $s_j = j$, $s_k = k$.

TABLE 2

| | Decoding Logic | |
|---|---|---|
| m | $\beta'$ | $m_l$ |
| 0 | 0 | 6 |
| 1,2,3 | 1 | 1 |
| 4,...,9 | 2 | 4 |
| 10,....,19 | 3 | 10 |
| 20,....,34 | 4 | 20 |

HARDWARE EMBODIMENT

ENCODER

Figure 4:
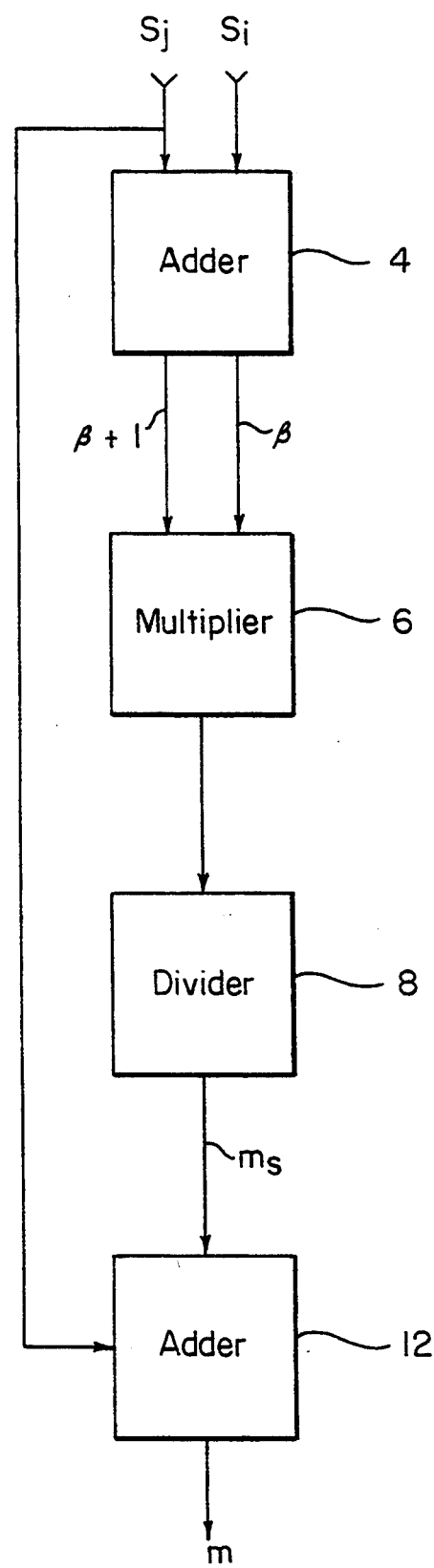
FIG. 4 is a depiction of the preferred hardware embodiment for the encoder portion of the present invention.

The preferred embodiment of the encoder is shown in FIG. 4. Every electronic signal containing a pair of data words are passed through this architecture. The data samples can be in 1's or 2's complement arithmetic integer numbers. Data pair $S_i$ and $S_j$ of values/and /are presented to adder means 4 to form $\beta$ and $\beta+1$ which in turn are multiplied by multiplication means 6. Division by two of the product $\beta(\beta+1)$ to generate $m_s$ can be accomplished with any known division means 8 and a shift register is one preferred embodiment. j and $m_s$ are finally added with an adder means 12. Code word for symbol $\gamma_m$ whose value is m, is generated with a comma code.

The arithmetic units in FIG. 4 can be realized with well known hardware components using either full custom or standard practice design methodologies.

This overall architecture can be implemented as a sequential or a pipelined data flow means. A pipelined implementation would introduce registers throughout the structure in accordance with well known techniques.

DECODER

Figure 5:
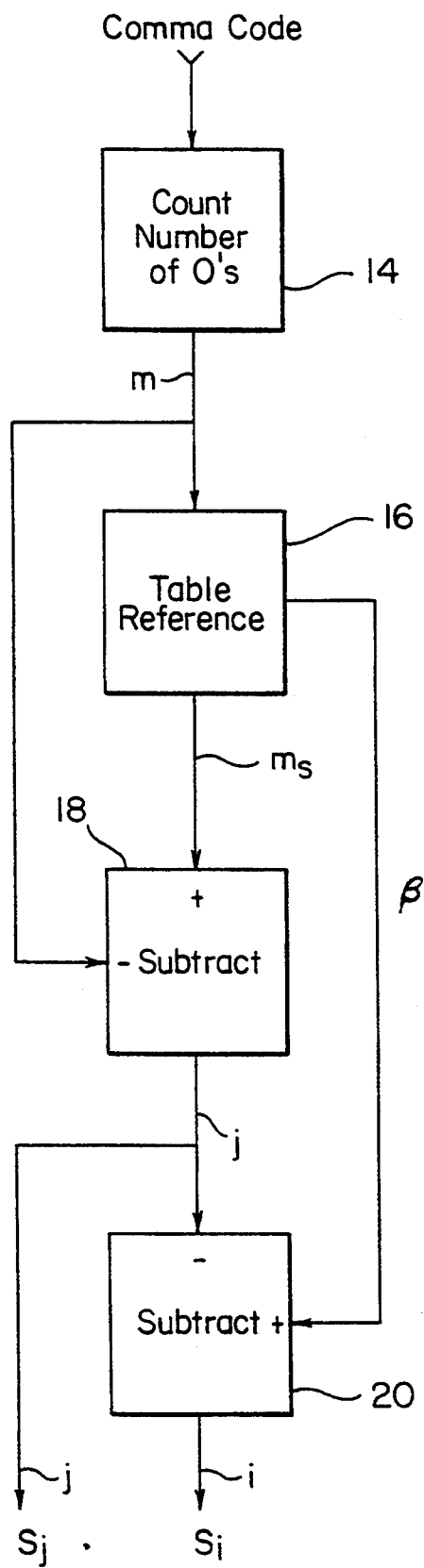
FIG. 5 is a depiction of the preferred hardware embodiment for the decoder portion of the present invention.

The preferred embodiment of the decoder is shown in FIG. 5. Every electronic signal containing a pair of data words are passed through this architecture. The data samples can be in 1's or 2's complement integers. $\gamma_m$ is obtained by counting the number of 0's in the comma code with counter means 14. There are several known techniques to count the number of 0's in a comma code. One preferred way is to increment counter 14 whenever a 0 appears in the serial bit stream. $m_s$ is generated from Table 2 Reference hardware 16. The preferred embodiment of the Table 2 Reference hardware is a memory device, such as Read Only memory. m is subtracted by subtraction means 18 from $m_s$ to create j. j is subtracted from B by subtraction means 20 to form i.

The arithmetic units in FIG. 5 can be realized with well known hardware components using either full custom or standard practice design methodologies.

This overall architecture can be implemented as a sequential or pipelined data flow means. A pipelined implementation would introduce registers throughout the structure in accordance with well known techniques.

To those skilled in the art, many modifications and variations of the present invention are possible in light of the above teachings. It is therefore to be understood that the present invention can be practiced otherwise than as specifically described herein and still will be within the spirit and scope of the appended claims.

I claim:

1. A method of coding a low entropy image signal generated by an imager comprising:

digitizing the image signal of low entropy generated by said imager into an array of digital image data;

determining the difference in value between adjacent digital image data points in the array;

mapping each said difference in value between said adjacent digital image data in the array into a first non-negative symbol set defined as a set S, $\{s_0, s_1, s_2, \ldots s_{N-1}\}$ of N symbols with $s_i=i$;

grouping consecutive symbols $S_0 \ldots S_{N-1}$ into a second non-negative symbol set defined as a symbol set $\Gamma$ including the symbols $\{\gamma_m\}$ obtained as the extension of the original symbol set S; and coding said second non-negative symbol set $\Gamma$ into a comma code so as to generate coded binary digital data representing a compressed image of said low entropy image signal generated by the imager.

2. The method of claim 1 wherein said grouping of consecutive symbols in said first non-negative symbol set S comprises grouping in groups of two.

3. The method of claim 2 wherein said step of mapping said groups of two consecutive symbols into said second non-negative symbol set $\Gamma$ including the symbols $\{\gamma_m\}$ comprises:

taking every two symbols $s_i$, $s_j$ from set S and calculating a variable $\beta=i+j$; and calculating a variable $m_s=\beta(\beta+1)/2$;

calculating the subscript m of $\gamma_m$ as $m=m_s+j$.

4. The method of claim 3 wherein said step of coding said second non-negative symbol set $\Gamma$ containing the symbols $\{\gamma_m\}$ into a comma code comprises assigning $\gamma_m=m$ and coding m with the comma code.

5. The method of claim 4 wherein said comma code of integer m consists is formed of m 0's followed by a 1.

6. The method of claim 5 further comprising decoding steps comprising:

restoring a first set of non-negative symbols $\gamma_m$ by counting the 0's of said comma code;

obtaining a variable $\beta$ and a variable $m_s$ using the following logic:

| | | |
|---|---|---|
| if m = 0 | then $\beta$ = 0 | and $m_s$ = 0 |
| if m = 1,2 | then $\beta$ = 1 | and $m_s$ = 1 |
| if m = 3,4,5 | then $\beta$ = 2 | and $m_s$ = 3 |
| if m = 6,...,9 | then $\beta$ = 3 | and $m_s$ = 6 |
| if m = 10,....,14 | then $\beta$ = 4 | and $m_s$ = 10 |
| if m = 15,....,20 | then $\beta$ = 5 | and $m_s$ = 15 |
| if m = 21,....,28 | then $\beta$ = 6 | and $m_s$ = 21 |
| if m = 28,....,35 | then $\beta$ = 7 | and $m_s$ = 28 |
| * | * | * |
| * | * | * |
| * | * | *; | calculating a variable $j=m-m_s$;

calculating a variable $i=\beta-j$; and restoring a second non-negative set of symbols according to $s_i=i$ and $s_j=j$.

7. The method of claim 1, wherein the entropy of the image signal from the imager is substantially less than 1 bits/sample.

8. The method of claim 7 wherein the entropy of said image signal from the imager is less than 0.75 bits/sample.

9. The method of claim 7 wherein the entropy of said image signal from the imager is in the range of 0.75 to 1.5 bits/sample.

10. The method of claim 1 wherein said grouping of consecutive symbols in said first non-negative symbols set S comprises grouping in groups of three.

11. The method of claim 10 wherein said step of mapping said groups of three consecutive symbols into said second non-negative symbol set $\Gamma$ containing the symbols $\{\gamma_m\}$ comprises:

taking every 3 symbols $s_i$, $s_j$, $s_k$ from set S, and calculating a variable $\beta'=i+j+k$ and variable $\beta=i+j$;

calculating variable $m_s=\beta(\beta+1)/2$;

determining $m_i$ using the following logic:

| | | |
|---|---|---|
| if m = 0 | then $\beta'$ = 0 | and $m_1$ = 0 |
| if m = 1,2,3 | then $\beta'$ = 1 | and $m_1$ = 1 |
| if m = 4,...,9 | then $\beta'$ = 2 | and $m_1$ = 4 |
| if m = 10,....,19 | then $\beta'$ = 3 | and $m_1$ = 10 |
| if m = 20,....,34 | then $\beta'$ = 4 | and $m_1$ = 20 |
| * | * | * |
| * | * | * |
| * | * | *; | calculating the subscript m of $\gamma_m$ as $m=m_s+m_i+i$.

12. The method of claim 11 wherein said step of coding said second non-negative symbol set $\Gamma$ including the symbols $\{\gamma_m\}$ into a comma code comprises assigning $\gamma_m=m$ and coding m with the comma code.

13. The method of claim 12 wherein said comma code of integer m is formed of m 0's followed by a 1.

14. The method of claim 13 further comprising decoding steps comprising:

obtaining $\gamma_m$ by counting the 0's of said comma code;

obtaining $\beta'$ and $m_i$ from the logic of claim 11;

calculating $m_s+i$ by $m_s+i=m-m_i$;

using the value of $m_s+i$ as the value of m in the logic of claim 11, obtaining $\beta$ and $m_s$;

calculating i from values obtained above;

calculating j from $\beta-i$;

calculating k from $\beta'-\beta$; and assigning $s_i=i$, $s_j=j$, $s_k=k$.

15. A method as in claim 1, wherein the digital image data in the array is gray-scale digital image data.

16. A decoding method for decoding a coded low entropy image signal, the low entropy image signal being generated by an imager comprising:

receiving a comma code formed of 0's followed by a 1, the comma code being representative of the coded image data, the image data being representative of a low entropy image signal generated by the imager;

restoring a first set of non-negative symbols a variable $\gamma_m$ by counting the 0's of said comma code;

obtaining a variable $\beta$ and a variable $m_s$ using the following logic:

| | | |
|---|---|---|
| if m = 0 | then $\beta = 0$ | and $m_s = 0$ |
| if m = 1,2 | then $\beta = 1$ | and $m_s = 1$ |
| if m = 3,4,5 | then $\beta = 2$ | and $m_s = 3$ |
| if m = 6,...,9 | then $\beta = 3$ | and $m_s = 6$ |
| if m = 10,....,14 | then $\beta = 4$ | and $m_s = 10$ |
| if m = 15,....,20 | then $\beta = 5$ | and $m_s = 15$ |
| if m = 21,....,28 | then $\beta = 6$ | and $m_s = 21$ |
| if m = 28,....,35 | then $\beta = 7$ | and $m_s = 28$ |
| * | * | * |
| * | * | * |
| * | * | *; | calculating a variable $j = m - m_s$;

calculating a variable $i = \beta - j$; and restoring a second non-negative set of symbols according to $s_i = i$ and $s_j = j$.

17. Apparatus for coding a low entropy image signal generated by an imager comprising:

digitizing means for digitizing the signal of low entropy generated by said imager into an array of digital image data;

difference means, operatively connected to the digitizing means, for determining the difference in value between adjacent digital image data points in the array;

mapping means, operatively connected to the difference means, for mapping each said difference in value between said adjacent digital image data in the array into a first non-negative symbol set defined as a set S, $\{S_0, S_1, S_2, \ldots S_{N-1}\}$ of N symbols with $s_i = i$;

grouping means, operatively connected to the mapping means, for grouping consecutive symbols $S_0 \ldots S_{N-1}$ into a second non-negative symbol set defined as a symbol set $\Gamma$ into a second no-negative symbol set defined as a symbol set $\Gamma$ including the symbols $\{\gamma\}$ obtained as the extension of the original symbol set S;

means, operatively connected to the group means, for coding said second non-negative symbol set $\Gamma$ into a comma code so as to generate coded binary digital data representing a compressed image signal of said low entropy image signal generated by the imager.

18. An apparatus as in claim 17, wherein the digital image data in the array is gray-scale digital image data.

19. An apparatus for decoding a coded low entropy image signal, the low entropy image signal being generated by an imager comprising:

receiving means for receiving a comma code formed of 0's followed by a 1, the comma code being representative of the coded image data, the image data being representative of a low entropy image signal generated by the imager;

first means, operatively connected to the receiving means, for a first set of non-negative symbols $\gamma_m$ by counting the 0's of said comma code;

second means, operatively connected to the first means, for obtaining a variable $\beta$ and a variable $m_s$ by implementing the following logic:

| | | |
|---|---|---|
| if m = 0 | then $\beta = 0$ | and $m_s = 0$ |
| if m = 1,2 | then $\beta = 1$ | and $m_s = 1$ |
| if m = 3,4,5 | then $\beta = 2$ | and $m_s = 3$ |
| if m = 6,...,9 | then $\beta = 3$ | and $m_s = 6$ |
| if m = 10,....,14 | then $\beta = 4$ | and $m_s = 10$ |
| if m = 15,....,20 | then $\beta = 5$ | and $m_s = 15$ |
| if m = 21,....,28 | then $\beta = 6$ | and $m_s = 21$ |
| if m = 28,....,35 | then $\beta = 7$ | and $m_s = 28$ |
| * | * | * |
| * | * | * |
| * | * | *; | third means, operatively connected to the second means, for calculating a variable $j = m - m_s$;

fourth means, operatively connected to the third means, for calculating a variable $i = \beta - j$; and fifth means, operatively connected to the fourth means, for restoring a second non-negative set of symbols according to $s_i = i$ and $s_j = j$.

* * * * *